United States Patent
Weon

(10) Patent No.: US 6,407,005 B2
(45) Date of Patent: Jun. 18, 2002

(54) METHOD FOR FORMING SEMICONDUCTOR DEVICE TO PREVENT ELECTRIC FIELD CONCENTRATION FROM BEING GENERATED AT CORNER OF ACTIVE REGION

(75) Inventor: Dae-Hee Weon, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/745,444

(22) Filed: Dec. 26, 2000

(30) Foreign Application Priority Data

May 23, 2000 (KR) ......................................... 2000-27647

(51) Int. Cl.[7] .............................................. H01L 21/00
(52) U.S. Cl. .................... 438/756; 216/99; 438/745; 438/757; 438/753
(58) Field of Search ................................ 438/692, 700, 438/719, 723, 724, 743, 744, 745, 753, 756, 757; 216/38, 88, 79, 99

(56) References Cited

U.S. PATENT DOCUMENTS

| 5,925,575 A | 7/1999 | Tao et al. ................ 438/723 X |
| 5,981,402 A | 11/1999 | Hsiao et al. ................ 438/756 |
| 6,271,143 B1 | 8/2001 | Mendicino .............. 438/756 X |

*Primary Examiner*—William A. Powell
(74) *Attorney, Agent, or Firm*—Jacobson Holman, PLLC

(57) ABSTRACT

A method for fabricating a field oxide layer capable of being applied to highly integrated circuits. The semiconductor device according to the present invention prevents electric field concentration at the corners of the active region, by filling a recess generated in a field oxide layer with an additional oxide spacer. The method includes the steps of a) forming a trench in a semiconductor substrate; b) forming an insulating layer on the resulting structure and burying the trench; c) forming a field oxide layer by controlling topology of the insulating layer in a wet etching process, wherein the wet etching process forms a recess at a corner of the field oxide layer so that a portion of sidewalls of the active region is exposed; d) forming an additional field oxide spacer layer at the recess in order to bury the exposed sidewall portion of the active region; and e) vertically growing an epitaxial layer on the exposed active region.

13 Claims, 4 Drawing Sheets

METHOD FOR FORMING SEMICONDUCTOR DEVICE TO PREVENT ELECTRIC FIELD CONCENTRATION FROM BEING GENERATED AT CORNER OF ACTIVE REGION

FIELD OF THE INVENTION

The present invention relates to a method for fabricating a semiconductor device and, more particularly, to a field oxide layer capable of being applied to a highly integrated DRAM (Dynamic Random Access Memory).

Description of the Prior Art

Generally, with the development of highly integrated circuits having a line width of 0.13 μcm or less, an epi-channel device using a selective epi-silicon has been developed in order to decrease variation of the threshold voltage caused by the gate length.

FIGS. 1A to 1C are cross-sectional views illustrating a method for making a conventional field oxide layer. Referring to FIG. 1A, a pad oxide layer 12 and a nitride layer 13 are deposited on a semiconductor substrate 11 in that order and a field region is defined by selectively patterning the pad oxide layer 12 and the nitride layer 13. A trench 14 is formed using the patterned pad oxide layer 12 and nitride layers 13 as an etching mask. Also, a photoresist layer may be used as an etching mask, instead of the patterned pad oxide and nitride layers 12, 13. This process of making a trench is called the STI (Shallow Trench Isolation) method.

Referring to FIG. 1B, a thin oxide layer 15 is formed by applying an oxidation process to inner sidewalls of the trench 14. The trench is buried in an oxide layer, and then a chemical and mechanical polishing is applied to the buried oxide layer until the nitride layer 13 is exposed. After a portion of the buried oxide layer is etched, a final field oxide layer 16 is formed by removing the nitride layer 13 and by isotropically etching the buried oxide layer. At this time, the topology of an edge of the field oxide layer 16 may be lower than that of the semiconductor substrate 11 leaving a recess (A); this is called the "Moat" phenomenon.

FIG. 1C illustrates a well ion-implantation process. A screen oxide layer (not shown) is formed on the exposed semiconductor substrate 11 and ion-implantation is carried out to adjust the threshold voltage. After removing the screen oxide layer, a channel epi(epitaxial)-silicon layer 17 is formed by the selective epitaxial growing method. At this stage, the channel epi-silicon layer 17 may grow at the edge of the trench 14 because of the recess A which was generated due to the "Moat" phenomenon. The edge of the active silicon in the semiconductor substrate 11 may have the recess A, because the channel epi-silicon layer 17 grows at the side of the exposed semiconductor substrate 11 while the epitaxial process for the channel epi-silicon layer 17 is carried out.

The channel epi-silicon layer 17 growing at the edge of the active silicon makes the gate oxide layer thin. Also, a polysilicon layer, which resides in the recess A, may connect transistors to each other at the time of forming word lines. Furthermore, an electric field is concentrated at the edge of the channel epi-silicon layer 17 so that the electric characteristics of the semiconductor device may be degraded.

SUMMARY OF THE INVENTION

It is, therefore, an object of the present invention to provide a method for fabricating a field oxide layer to isolate other adjacent devices.

It is another object of the present invention to provide an improved semiconductor device to prevent INWE (Inverse Narrow Width Effect) in which threshold voltage of a MOS transistor decrease due to the decreased gate width.

It is a further object of the present invention to provide a method fir fabricating a field oxide layer having improved electrical characteristics without there being an electric field concentrated at an edge between a field oxide layer and an active region.

In accordance with an aspect of the present invention, there is provided a method for forming a semiconductor device comprising: a) forming a trench in a semiconductor substrate; b) forming an insulating layer on the resulting structure and burying the trench; c) forming a field oxide layer by controlling topology of the insulating layer in a wet etching process, wherein the wet etching process forms a recess at a corner of the field oxide layer so that a portion of sidewalls of the active region is exposed; d) forming an additional field oxide spacer layer at the recess in order to fill the exposed sidewall portion of the active region; and e) vertically growing an epitaxial layer on the exposed active region.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, a method for forming a field oxide layer according to the present invention will be described in detail referring the accompanying drawings.

Figure 1A:
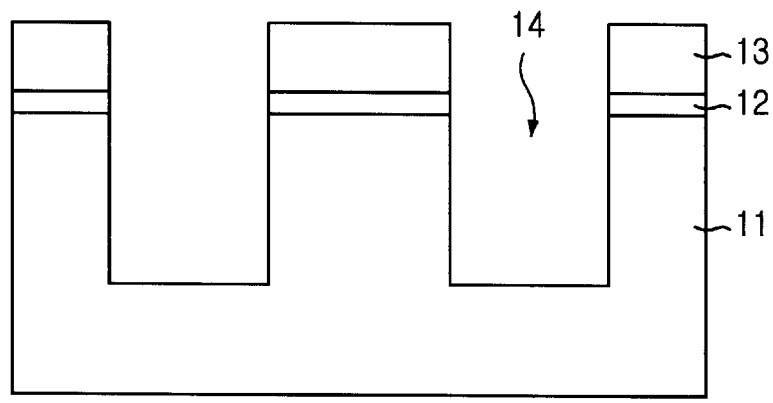
FIGS. 1A to 1C are cross-sectional views illustrating a method for making a conventional field oxide layer.
Figure 1B:
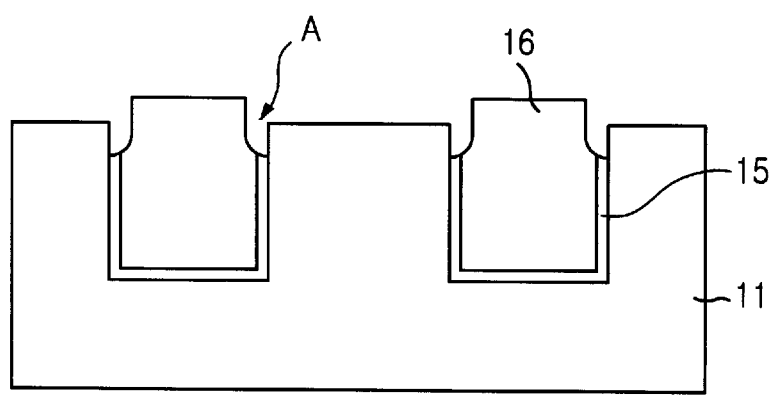
Figure 1C:
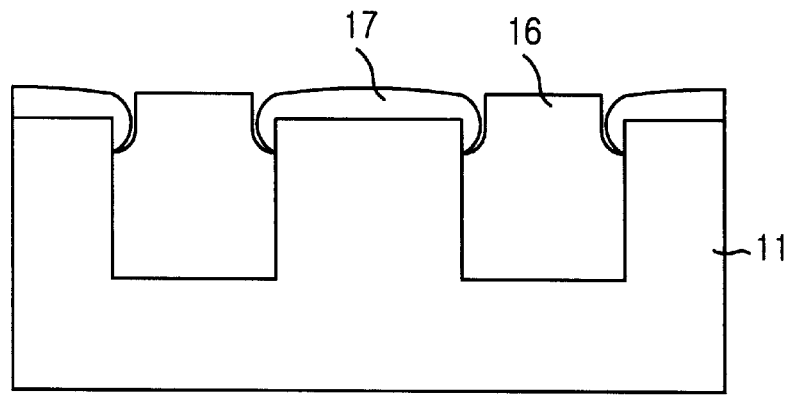
Figure 2A:
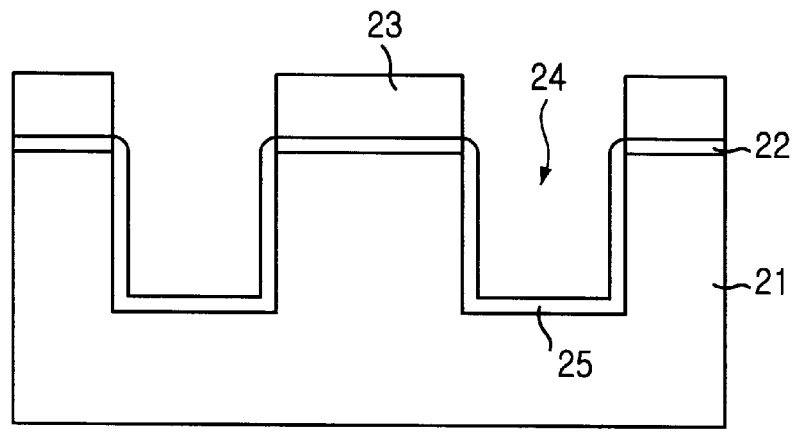
FIGS. 2A to 2E are cross-sectional views illustrating a method for making a field oxide layer according to the present invention.

First, referring to FIG. 2A, a pad oxide layer 22 is formed on a semiconductor substrate 21 to a thickness of approximately 50 to 200 Å and a nitride layer 23 is formed on the pad oxide layer 22 to a thickness of approximately 1000 Å to 3000 Å. An etching mask (not shown) is formed on the nitride layer 23 to define a field region, and the nitride layer 23 and the pad oxide layer 22 are selectively etched. Further, a trench 24 is formed by forming a recess in the semiconductor substrate 21 using the etched pad oxide and nitride layers 22, 23 as an etching mask. A photoresist layer may also be used as an etching mask, instead of the patterned pad oxide and nitride layers 22, 23. At this stage, the depth of the trench 24 is about 1500 to 4000 Å and other regions in which the trench is not formed are defined as an active region. A thermal oxide layer 25 is then formed on sidewalls of the trench 24 to a thickness of approximately 50 to 200 Å by applying a thermal oxidation process to the trench 24.

Figure 2B:
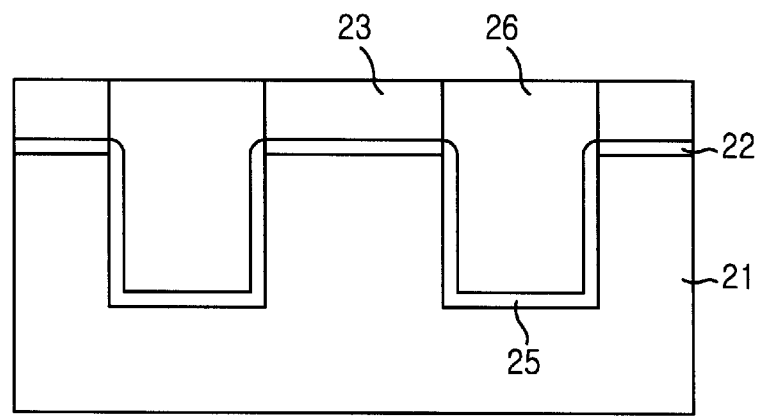

Referring to FIG. 2B, an insulating layer 26 is deposited on the resulting structure and then the trench 24 is completely filled with the insulating layer 26. A CMP (Chemical Mechanical Polishing) step is applied to the insulating layer 26 until the nitride layer 23 is exposed.

The thermal oxide layer 25 may be formed by a wet-oxidation process and/or a dry-oxidation process and the insulating layer 26 may be formed by the high density plasma CVD or $O_3$-TEOS (tetraethylorthosilicate) CVD. In a preferred embodiment, topology of the insulating layer 26 may be formed higher than that of the nitride layer 23 by approximately 3000 to 5000 Å.

Figure 2C:
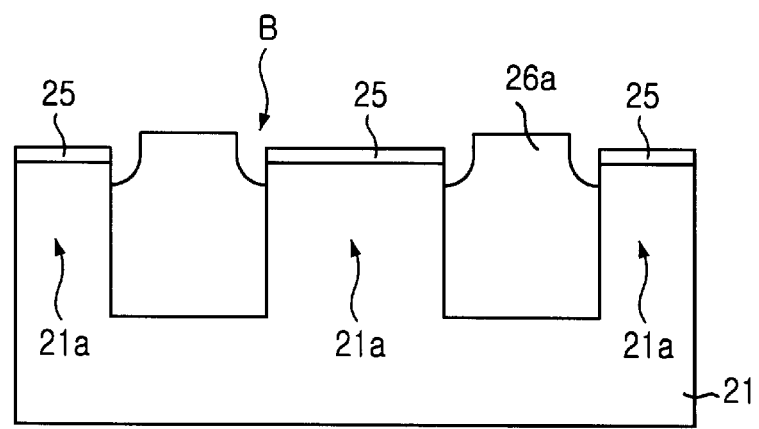

Referring to FIG. 2C, after removing a portion of the insulating layer 26 using a wet etching process and removing the nitride layer 23, a field oxide layer 26a is formed by isotropically etching a determined thickness of the insulating layer 26. In a preferred embodiment, a wet etching process to decrease the height of the insulating layer 26 is controlled so that 200 to 500 Å of the thickness of the insulating layer 26 is etched in an oxide-etching solution. The nitride layer 23 is removed by a wet etching process using a phosphoric acid until the semiconductor substrate 21 is exposed and a screen oxide layer 25 is formed on the exposed semiconductor substrate 21. As a result of the "Moat" phenomenon, a recess B, in which the topology of the field oxide layer 26a is lower than that of an active region 21a of the semiconductor substrate 21, occurs between the field oxide layer 26a and the active region 21a by the wet etching process.

Figure 2D:
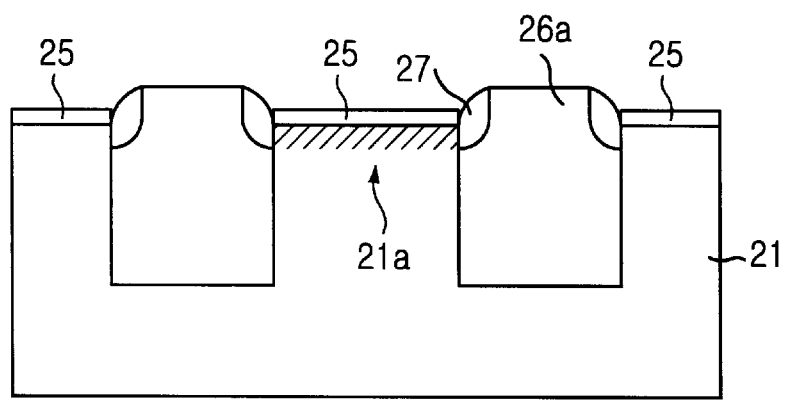

Referring to FIG. 2D, a well ion-implantation process having a high acceleration energy is carried out and the Rapid Thermal Treatment (RTP) is performed at a temperature of about 950° C. for a few seconds. After performing a low energy ion-implantation process to adjust the threshold voltage in a surface of the active region 21a, the screen oxide layer 25 is removed. An oxide layer to form an oxide spacer 27 in the recess is formed on the resulting structure and the oxide layer is etched back. Accordingly, the recess B caused by the "Moat" phenomenon, which is formed when the wet etching process is applied to the insulating layer 26, is filled with the oxide spacer 27. The oxide spacer 27 formed at the recess compensates the field oxide layer 26a for its damaged portion.

Figure 2E:
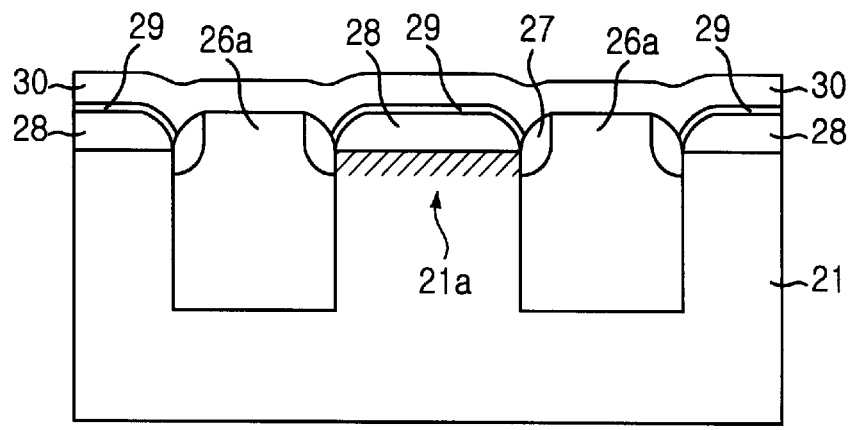

Referring to FIG. 2E, a channel epi-silicon layer 28 is formed on the exposed active region 21a by the selective epitaxial growing method. The channel epi-silicon layer 28 may come from an undoped epi-silicon layer, which is formed to a thickness of 100 to 500 Å by the LPCVD (Low Pressure Chemical Vapor Deposition) or UHVCVD (Ultra High Vacuum Chemical Vapor Deposition). At this time, since the oxide spacer 27 is formed at the recess of the field oxide layer 26a that is generated in the vicinity of the active region 21a, it is possible to prevent the epi-silicon layer 28 from growing at the sidewalls of the exposed active region 21a. As a result, concentration of electric field at the corners of the active region 21a is prevented by removing such a recess using the additional oxide spacer 27. Accordingly, it is possible to prevent INWE (Inverse Narrow Width Effect) in which threshold voltage of a MOS transistor is decreased due to the decreased gate width.

After forming the epi-silicon layer 28, a gate oxide layer 29 and a gate electrode layer 30 are formed, in that order. When a polysilicon layer for the gate electrode layer 30 is etched, polysilicon particle residue may be avoided because the recess has been filled with the oxide spacer 27.

As apparent from the above, the semiconductor device according to the present invention prevents the electric field concentration at the corner of the active region, by filling the recess with the additional oxide spacer. Furthermore, since the recess in the field oxide layer is removed, any residue, such as particle of the polysilicon for the gate electrode, may be avoided and the electrical characteristics of the semiconductor device may be improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a semiconductor device, comprising steps of:
    a) forming a trench in a semiconductor substrate, the trench defining an active region;
    b) depositing an insulating layer over the trench;
    c) forming a field oxide layer by controlling topology of the insulating layer in a wet etching process, wherein the wet etching process forms recesses at corners of the field oxide layer so that a top portion of sidewalls of the active region is exposed;
    d) forming an additional field oxide spacer layer over the recesses in order to bury the exposed sidewall portion of the active region; and
    e) vertically growing an epitaxial layer on an exposed active region.

2. The met hod as recited in claim 1, wherein the step (a) comprises steps of:
    a-1) forming a pad oxide layer and then a nitride layer on the semiconductor substrate;
    a-2) patterning the nitride layer and the pad oxide layer; and
    a-3) forming the trench by etching the semiconductor substrate using one of the patterned nitride layer and a photoresist layer as an etching mask.

3. The method as recited in claim 2, wherein the pad oxide layer is formed to a thickness of approximately 50 to 200 Å.

4. The method as recited in claim 2, wherein the nitride layer is formed to a thickness of approximately 1000 to 3000 Å.

5. The method as recited in claim 2, wherein the trench has a depth of approximately 1500 to 4000 Å.

6. The method as recited in claim 1, wherein the step (a) further comprise s a step of forming a thermal oxide layer on sidewalls of the trench to a thickness of approximately 50 to 200 Å by using a dry-oxidation or wet-oxidation process.

7. The method as recited in claim 1, wherein the field oxide layer is formed by a high density plasma CVD or $O_3$-TEOS CVD process.

8. The method as recited in claim 1, wherein the step (c) comprises a step of chemically and mechanically polishing the field oxide layer.

9. The method as recited in claim 1, wherein the step (c) comprises a step of etching back the insulating layer by approximately 200 to 500 Å.

10. The method as recited in claim 1, wherein the epitaxial layer is an undoped silicon layer and has a thickness of approximately 100 to 500 Å.

11. The method as recited in claim 1, wherein the epitaxial layer is formed by a LPCVD or UHVCVD method.

12. The method as recited in claim 2, wherein topology of the insulating layer is formed higher than that of the nitride layer by approximately 3000 to 5000 Å.

13. The me hod as recited in claim 1, wherein the step (d) comprises steps of:
    forming a screen oxide layer on the semiconductor substrate; and
    implanting ions into a well region in the semiconductor substrate to adjust threshold voltage.

* * * * *